(12) United States Patent
Gendron et al.

(10) Patent No.: US 9,018,072 B2
(45) Date of Patent: Apr. 28, 2015

(54) ESD PROTECTION DEVICE AND METHOD

(71) Applicants: Amaury Gendron, San Jose, CA (US); Chai Ean Gill, Chandler, AZ (US); Changsoo Hong, Phoenix, AZ (US)

(72) Inventors: Amaury Gendron, San Jose, CA (US); Chai Ean Gill, Chandler, AZ (US); Changsoo Hong, Phoenix, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 14/168,813

(22) Filed: Jan. 30, 2014

(65) Prior Publication Data

US 2014/0147983 A1 May 29, 2014

Related U.S. Application Data

(62) Division of application No. 12/690,771, filed on Jan. 20, 2010, now Pat. No. 8,648,419.

(51) Int. Cl.
*H01L 21/331* (2006.01)
*H01L 29/66* (2006.01)
*H01L 27/02* (2006.01)
*H01L 29/735* (2006.01)
*H01L 29/08* (2006.01)

(52) U.S. Cl.
CPC ...... *H01L 29/66234* (2013.01); *H01L 27/0259* (2013.01); *H01L 29/0821* (2013.01); *H01L 29/6625* (2013.01); *H01L 29/735* (2013.01)

(58) Field of Classification Search
None
See application file for complete search history.

(56) References Cited

U.S. PATENT DOCUMENTS

| 2005/0207077 | A1 | 9/2005 | Xu et al. | |
| 2006/0091497 | A1 | 5/2006 | Sato | |
| 2007/0210419 | A1 | 9/2007 | Nawate et al. | |
| 2008/0044955 | A1* | 2/2008 | Salcedo et al. | 438/140 |
| 2009/0032814 | A1 | 2/2009 | Vashchenko et al. | |
| 2010/0320501 | A1* | 12/2010 | Gendron et al. | 257/173 |
| 2011/0176243 | A1* | 7/2011 | Zhan et al. | 361/56 |
| 2012/0175673 | A1* | 7/2012 | Lee | 257/140 |

FOREIGN PATENT DOCUMENTS

| JP | 09191079 H | 7/1997 |
| JP | 2003282715 A | 10/2003 |
| JP | 2006186225 A | 7/2006 |
| JP | 2007214526 A | 8/2007 |
| JP | 2007242923 A | 9/2007 |
| WO | 2009048911 A1 | 4/2009 |

OTHER PUBLICATIONS

Japanese Patent and Trademark Office, Office Action for Japanese Patent Application No. 2012550023, mailed Feb. 17, 2015.

* cited by examiner

*Primary Examiner* — Evan Pert
*Assistant Examiner* — Herve Assouman
(74) *Attorney, Agent, or Firm* — Ingrassia Fishger & Lorenz, PC

(57) ABSTRACT

An electrostatic discharge (ESD) protection clamp (21, 21', 70, 700) for protecting associated devices or circuits (24), comprises a bipolar transistors (21, 21', 70, 700) in which doping of facing base (75) and collector (86) regions is arranged so that avalanche breakdown occurs preferentially within a portion (84, 85) of the base region (74, 75) of the device (70, 700) away from the overlying dielectric-semiconductor interface (791). Maximum variations $(\Delta Vt1)_{MAX}$ of ESD triggering voltage Vt1 as a function of base-collector spacing dimensions D due, for example, to different azimuthal orientations of transistors (21, 21', 70, 700) on a semiconductor die or wafer is much reduced. Triggering voltage consistency and manufacturing yield are improved.

18 Claims, 9 Drawing Sheets

30

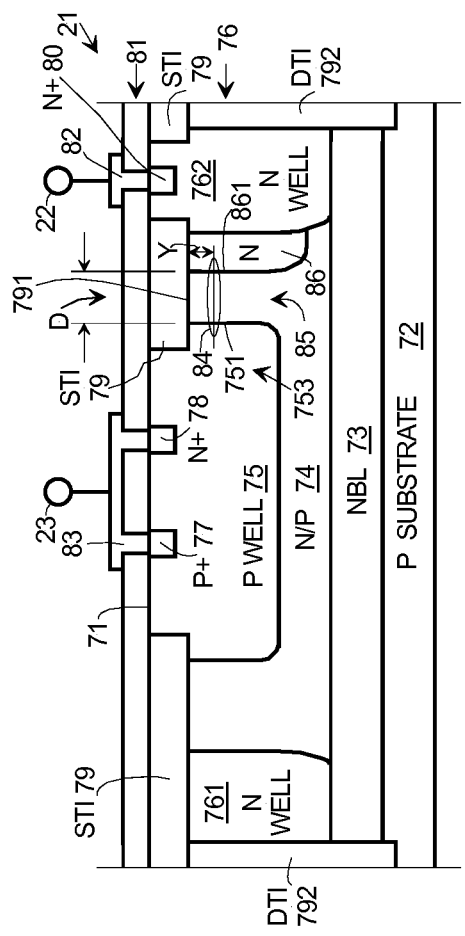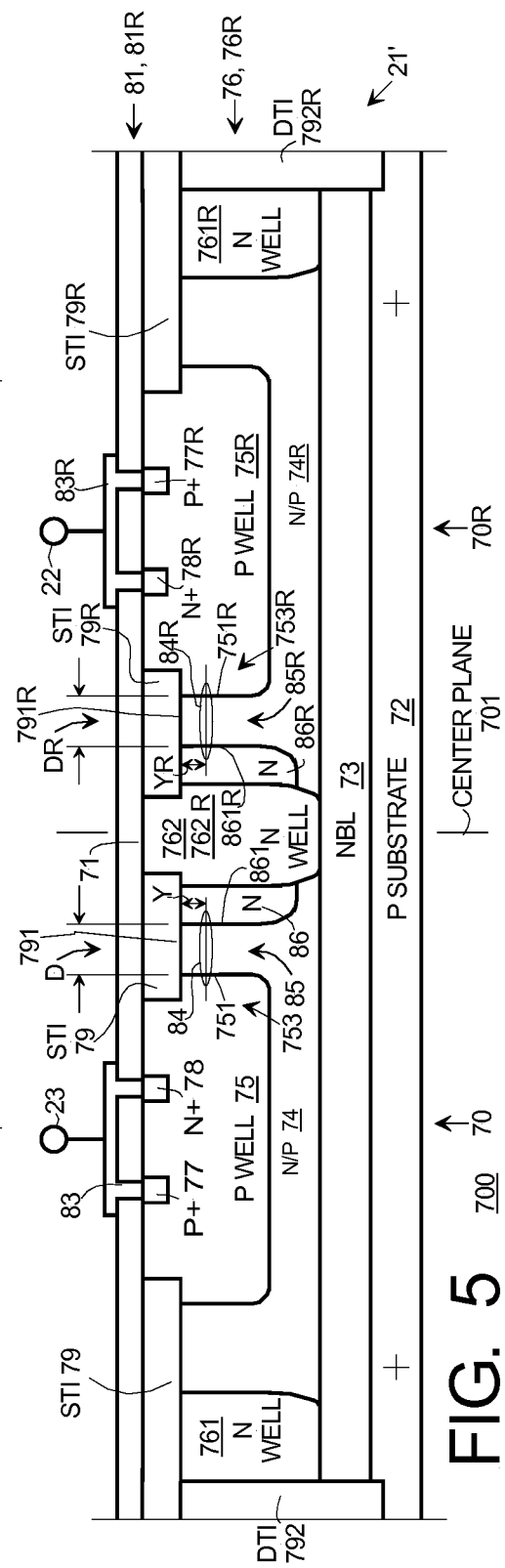

ESD PROTECTION DEVICE AND METHOD

CROSS-REFERENCES TO RELATED APPLICATIONS

This is a divisional of co-pending U.S. application Ser. No. 12/690,771, filed Jan. 20, 2010.

TECHNICAL FIELD

Embodiments of the present invention generally relate to semiconductor devices and methods for fabricating semiconductor devices, and more particularly relate to semiconductor devices used for electrostatic discharge (ESD) protection in integrated and other circuits, and electronic assemblies.

BACKGROUND

Modern integrated circuits (ICs) and electronic assemblies, and the devices therein, are at risk of damage due to electrostatic discharge (ESD) events. This is well known in the art. Accordingly, it is commonplace to provide an ESD clamp (voltage limiting device) across the terminals of such devices, IC's and electronic circuits or assemblies. As used herein, the term integrated circuit and the abbreviation IC are intended to refer to any type of circuit or electronic assembly whether formed in a monolithic substrate or as individual elements or a combination thereof.

BRIEF DESCRIPTION OF THE DRAWINGS

The present invention will hereinafter be described in conjunction with the following drawing figures, wherein like numerals denote like elements, and wherein:

FIG. 4 shows a simplified cross-sectional view of an ESD clamp transistor implemented in a semiconductor substrate and suitable for use in the circuits of FIGS. 1-2, according to an embodiment of the present invention;

FIG. 5 shows a simplified cross-sectional view of a dual-polarity ESD clamp implemented in a semiconductor substrate, analogous to that of FIG. 4, but according to a further embodiment of the present invention wherein a bidirectional ESD clamp function is provided;

DETAILED DESCRIPTION

Figure 1:
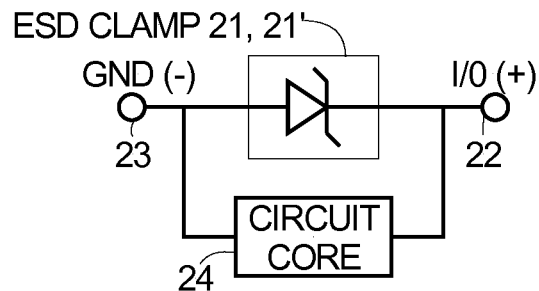
FIG. 1 is a simplified schematic diagram of a circuit or electronic assembly wherein an electrostatic discharge (ESD) clamp is placed between an input-output (I/O) terminal and a ground or common terminal of an IC to protect other devices in the IC, that is, to protect the "circuit core" coupled to the I/O terminals.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication are described herein for silicon semiconductors but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

FIG. 1 is a simplified schematic diagram of circuit 20 wherein ESD clamp 21 is placed, for example, between input-output (I/O) terminal 22 and ground or common terminal 23 of an IC to protect other devices therein, that is, to protect "circuit core" 24 also coupled to I/O and common terminals 22, 23. Person of skill in the art will understand that ESD clamp 21 may be placed across any terminals of the IC, and reference herein to I/O terminals is intended to include any and all other terminals not merely those used for input or output signals. Further, the Zener diode symbol illustrated in block 21 of FIG. 1 is merely for convenience of identifying the voltage limiting function of ESD block 21 and not intended to imply that a Zener diode is necessarily present therein. With respect to structures or elements used for ESD protection, the terms device, clamp and transistor are used interchangeably.

Figure 2:
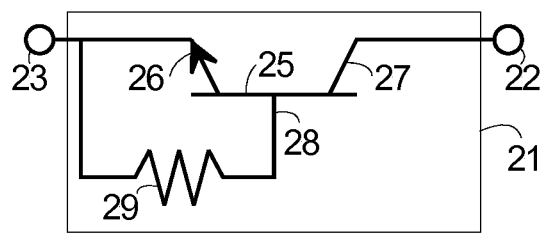
FIG. 2 is a simplified schematic diagram illustrating internal components of the ESD clamp of FIG. 1.

FIG. 2 is a simplified schematic diagram illustrating internal components of ESD clamp 21 employing bipolar transistor 25, having emitter 26, collector 27, base 28, and internal resistance 29, coupled across I/O terminals 22, 23. When the voltage across terminals 22, 23 rises beyond a predetermined limit, bipolar transistor 25 turns on, limiting the voltage across terminals 22, 23, desirably to a level below that capable of damaging circuit core 24.

Figure 3:
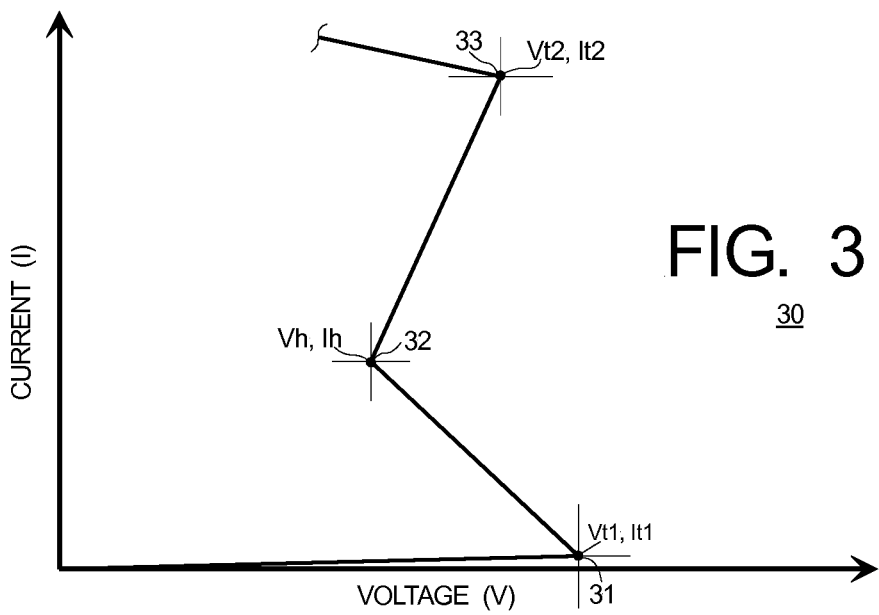
FIG. 3 is a simplified plot of current versus voltage for a typical ESD protection device.

FIG. 3 shows simplified plot 30 of transmission line pulse current (I) versus voltage (V) for a typical electrostatic discharge (ESD) protection device such as, for example, device 21 of FIG. 2. As the applied voltage is increased, very little current flows until triggering voltage 31 is reached at voltage Vt1. Once triggered into operation, the ESD device conducts and the current increases to holding point 32 with current Ih and voltage Vh. Depending upon the internal impedance of the voltage source, current and voltage may further increase to point 33 at current It2 and voltage Vt2, beyond which destructive failure may occur leading to further current increase accompanied by voltage decrease.

Electrostatic discharge (ESD) protection devices are intended to remain quiescent during normal operation of the associated semiconductor (SC) device(s) or non-SC device(s) or integrated circuit (IC) (i.e., the protected element(s) or circuit core 24) having a normal operating voltage V0, but turn on when excessive voltage arises, thereby preventing damage to the protected element(s). The triggering voltage Vt1 of the ESD device should exceed the maximum normal DC operating voltage Vo(MAX) of the protected elements, otherwise the ESD device will interfere with normal operation of the protected elements. Further, Vt1 should be less than, for example, a voltage $V_{TR}$ (usually a transient voltage) large enough to damage the protected element(s), hereafter referred to as the protected element break-down voltage, abbreviated as $V_{TR}$(PEBD). Thus, the ESD device should be designed so that Vo(MAX)<Vt1<$V_{TR}$(PEBD). It is commonplace to provide a number of ESD clamps 21 on a SC die or wafer so that all of the various terminals of the IC or electronic assembly may be protected. It is usually important that the Vt1 values for these several ESD clamps be similar or lie within a narrow predetermined range.

When bipolar transistor 25 of FIG. 2 is used for ESD clamp 21, the triggering voltage Vt1 is heavily influenced by the base-collector spacing of transistor 25. Unfortunately, it is often the case that even though several clamp transistors 25 are manufactured at the same time on the same SC wafer or die using nominally the same mask shapes and dimensions, there can be significant variation in the base-collector spacing in different parts of the SC wafer and/or die as a function, for example, of the azimuthal orientation of transistor 25 on the wafer or die. This has the result that Vt1 of nominally identical clamp devices can be different in different regions of the same IC, depending, for example, on their relative azimuthal orientation on the IC wafer or die. This Vt1 variation (hereafter ΔVt1) can adversely affect overall manufacturing yield and is not desirable. In the past, various process modifications have been used to minimize ΔVt1, but such modifications are often accompanied by an undesirable increase in manufacturing cost or other difficulties.

Accordingly, there is an ongoing need to provide improved ESD clamps that operate at more consistent triggering voltages Vt1 independent of their location or orientation on a particular IC die or wafer, that is, to minimize ΔVt1. Further, it is desirable that the improved ESD clamps be obtainable without significant modification of the manufacturing process used for forming the ESD clamps and the associated circuit core of the IC. Furthermore, other desirable features and characteristics of the present invention will become apparent from the subsequent detailed description of the invention and the appended claims, taken in conjunction with the accompanying drawings and this

BACKGROUND OF THE INVENTION

FIG. 4 shows a simplified cross-sectional view of ESD clamp transistor 70 implemented in a semiconductor substrate according to an embodiment of the present invention. Transistor 70 is formed in substrate 72 (e.g. P) having buried layer region 73 therein (e.g., N type, abbreviated as NBL 73). Overlying NBL 73 is region 74 extending from NBL 73 to upper surface 71. Region 74 may be either N or P. depending upon the particular process available and the desired devices being fabricated at the same time. Hence, region 74 is identified in the various drawings as being "NIP" indicating that either conductivity type may be used. In a preferred embodiment, P type is used. Within region 74 are shallow trench dielectric isolation (STI) regions 79 having interface 791 with the underlying semiconductor, WELL regions 761 and 762 (e.g., N type, collectively 76) with contact region 80 (e.g., N+) in region 762, and WELL region 75 (e.g., P type) with lateral interface or boundary 751. Further N region 86 is provided in electrical contact with N WELL region 762 with lateral interface or boundary 861 facing toward interface 751 of P WELL region 75 and separated therefrom by distance D. Doped contact region 77 (e.g., P+) is provided in P WELL region 75 to make Ohmic contact to P WELL region 75. Doped region 78 (e.g., N+) in P WELL region 75 serves as the emitter of transistor 70. P WELL region 75 serves as the base of transistor 70. N WELL regions 86, 762 with N+ contact region 80 serve as the collector of transistor 70. Intermediate portion 85 of region 74 lies between interfaces or boundaries 751, 861 separated by distance D. As will be subsequently explained, intermediate portion 85 of region 74 is more lightly doped than adjacent regions 75 and 86. As the voltage applied between terminals 22, 23 of transistor 70 approaches avalanche conditions, more lightly doped intermediate portion 85, whether of N or P type, becomes substantially depleted of free carriers, and effectively defines the base-collector spacing. Hence, for convenience of explanation, distance D across intermediate portion 85 between boundaries 751, 861 is referred to herein as the base-collector spacing irrespective of whether potion 85 is N type or P type. Dielectric layer 81 is conveniently provided on surface (e.g., interface) 71 with openings therein extending to base contact region 77, emitter region 78 and collector contact region 80. Conductor 82 makes Ohmic contact to collector contact region 80, and conductor 83 makes Ohmic contact to base contact region 77 and emitter region 78, connecting regions 77, 78 together. Conductor 82 of transistor 70 is conveniently coupled to terminal 22 of ESD clamp 21 (see FIG. 2) and circuit 20 (see FIG. 1) and conductor 83 of transistor 70 is conveniently coupled to terminal 23 of ESD clamp 21 and circuit 20.

P WELL base region 75 and collector region 86 are generally more heavily doped than intermediate portion 85 of region 74 lying between boundaries or interfaces 751, 861 separated by distance D, for example, usefully at least about 5 times more heavily doped, more conveniently at least about 10 time more heavily doped and preferably in the range of about 50-400 times more heavily doped than intermediate portion 85 of region 74. The relative doping of the various regions is discussed in more detail in connection with FIGS. 7-18.

When a sufficiently large voltage is applied between terminals 22, 23, intermediate portion 85 of base region 75, 85 becomes depleted of free carriers and distance D represents the base-collector spacing. As the applied voltage increases to Vt1, avalanche breakdown occurs across distance D in region 84 of intermediate portion 85 between boundary or interface 751 of P WELL 75 and boundary or interface 861 of further N region 86. Thus, the voltage Vt1 at which avalanche breakdown occurs in transistor 70 depends upon spacing dimension D between interface or boundary 861 of collector N region 86 and interface or boundary 751 of base P WELL region 75 and spacing dimension D between interfaces or boundaries 751, 861 may be used to adjust Vt1; the larger spacing dimension D the higher Vt1 and the smaller spacing dimension D the smaller Vt1. It has been found that by adjusting the doping profiles (e.g., the shape and/or doping concentration of interfaces or boundaries 751, 861) of P WELL base region 75 and further N region 86, that avalanche breakdown region 84 can be constrained to occur at specific depth Y>0 beneath semiconductor-dielectric interface 791 of STI region 79 and that the sensitivity $\Delta$Vt1 of triggering voltage Vt1 to uncontrolled variations AD of spacing dimension D can be much reduced. This is discussed in more detail in connection with FIG. 6 and FIGS. 7-18.

FIG. 5 shows a simplified cross-sectional view of dual polarity (bi-directional) ESD clamp 700 implemented in semiconductor substrate 72 (e.g., P), analogous to single polarity (unidirectional) ESD clamp 70 of FIG. 4, but according to a yet further embodiment of the present invention. Dual polarity ESD clamp 700 can be provided as ESD clamp 21' of FIG. 1. ESD clamp 700 comprises ESD transistor 70 (e.g., at the left in FIG. 5) of the type described in connection with FIG. 4, combined with ESD transistor 70R (e.g., at the right in FIG. 5) of the same type as ESD transistor 70 of FIG. 4 but laterally mirrored or reflected in center plane 701. The discussion of the various regions of ESD transistor 70 of FIG. 4 applies to FIG. 5. The same reference numbers are used in connection with ESD transistor 70 at the left of FIG. 5 and analogous reference numbers are used in connection with transistor 70R at the right of FIG. 5 modified by the addition of "R" to indicate that they are laterally reflected or mirrored in plane 701 compared to the equivalent regions in transistor 70. Thus, ESD transistor 70 of FIG. 5 (like ESD transistor 70 of FIG. 4) has P WELL region 75 with boundary or interface 751, N WELL regions 761, 762 (collectively 76), P+ region 77, N+ region 78, avalanche zone 84 in intermediate portion 85 of N/P region 74, further N region 86 with boundary or interface 861, STI regions 79 with interface 791, dielectric layer 81, conductive base-emitter contact conductor 83 and base-collector spacing dimension D between interfaces 751, 861. Contact conductor 83 is conveniently coupled to GND or common terminal 23 (see FIG. 1). ESD transistor 70R has equivalent regions 75R, 751R, 761R, 762R, 76R, 77R, 78R, 84R, 85R, 74R, 86R, 861R, 79R, 81R, 83R and base-collector spacing dimension DR between interfaces 751R, 861R, in mirror configuration to the corresponding regions in transistor 70. Substrate 72 and NBL 73 are common. N WELL collector region 762 of transistor 70 and N WELL collector region 762R of transistor 70R are merged around center plane 701. Base-emitter contact conductor 83R is coupled to I/O terminal 22 of FIG. 1. Because collector regions 762 and 762R are merged, conductor 82 of device 70 of FIG. 4 is not needed in the arrangement of device 700 of FIG. 5 but may be included in other embodiments. For the same reason, N+ collector contact region 80 (and 80R) of device 70 of FIG. 4 is also conveniently omitted, but may be included in still other embodiments. Back-to-back ESD clamp transistors 70, 70R provide dual polarity (bi-directional) ESD clamp 21' of circuit 20 of FIG. 1. If a positive voltage is applied to I/O terminal 22 with respect to terminal 23, then transistor 70R is forward biased and transistor 70 is reverse biased and spacing dimension D substantially determines triggering voltage Vt1. When a negative voltage is applied to I/O terminal 22 with respect to terminal 23, then transistor 70 is forward biased and transistor 70R is reverse biased and spacing dimension DR substantially determines triggering voltage Vt1R. The forward and reverse triggering voltages Vt1 and VT1R may be substantially the same or different depending on whether D and DR are substantially the same or different. Either arrangement is useful. The discussion that follows illustrating how the variations in Vt1 due to unavoidable variations in spacing dimension D may be reduced, is described in terms of single polarity (unidirectional) ESD clamp 21 of the type illustrated in FIG. 4, but persons of skill in the art will understand based on the description herein how such improvements also apply to dual polarity (bi-directional) ESD clamp 21' of FIG. 5. The discussion of depth Y in connection with FIG. 4 also applies to analogous depths Y, YR of FIG. 5.

Figure 6:
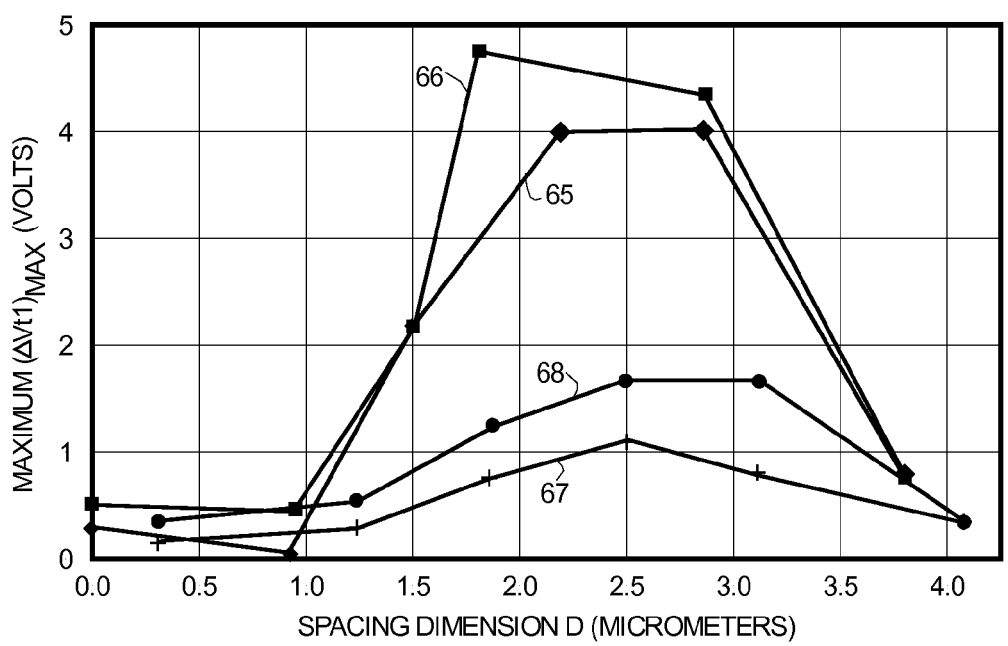
FIG. 6 is a simplified plot of the difference $(\Delta Vt1)_{MAX}$ (in volts) between the highest triggering voltage Vt1 of an ESD clamp transistor among four different azimuthal orientations on a die and the lowest triggering voltage Vt1 among the same four azimuthal orientations, as a function of the lateral base-collector spacing dimension D in micrometers.

FIG. 6 shows simplified plot 64 of the difference $(\Delta Vt1)_{MAX}$ (in volts) between the highest triggering voltage Vt1 of an ESD clamp transistor among four different azimuthal orientations on a die and the lowest triggering voltage Vt1 among the same four different azimuthal orientations, as a function of the lateral base-collector spacing dimension D in micrometers. Each of traces 65, 66, 67, 68 corresponds to a different process condition, leading to different depths Y of the avalanche region 84. Traces 65, 66 of plot 64 correspond to embodiments wherein depth Y of avalanche breakdown region 84 of FIG. 4 is relatively shallow and therefore closer to interface 791 of overlying STI region 79. Traces 67, 68 of plot 64 correspond to embodiments in which depth Y of avalanche breakdown region 84 is adjusted to insure that avalanche breakdown region 84 lies within the bulk of intermediate portion 85 of semiconductor region 74 below interface 791 of STI region 79. The doping profiles associated with boundaries or interfaces 751, 861 provided to insure that avalanche breakdown region 84 is constrained to lie well within bulk region 74 and not close to interface 791 of overlying STI region 79 are discussed in more detail in connection with FIGS. 7-17 illustrating the process by which transistor 70 is manufactured and in connection with FIG. 18 showing further details of interfaces or boundaries 751, 861 of doped regions 75, 86 in intermediate portion 85 of region 74 beneath interface 791.

FIGS. 7-17 are simplified cross-sectional views of ESD clamp 70 of FIG. 4 during various stages 108-118 of manufacture and illustrating resulting structures 208-218, according to still yet further embodiments of the present invention and showing additional detail. Doping levels and/or doping doses are included in the discussion of FIGS. 8-18 by way of describing a preferred embodiment and not for limitation. Ion implantation is a preferred method of doing various regions within device 70 but is not intended to be limiting and other doping methods well known in the art may also be used. Photo resist is a suitable masking material for use with ion implant doping and is presumed in what follows unless otherwise specifically noted, but is not intended to be limiting. Persons of skill in the art will understand that other types of masking layers or materials well known in the art may also be used depending on the dopant and doping method desired to be used. Similarly, the manufacturing process is illustrated for silicon semiconductor, by way of example and not limitation. Those of skill in the art will understand that substantial modification of the choice of semiconductor material, dopants, doping methods, doping levels and/or doses and dimensions of various regions within device 70 (and device 700) may be made depending upon the particular device characteristics desired and that those presented herein are made by way of example not intended to be limiting. Reference should also be made to FIG. 4 to identify various regions whose formation is described herein.

Figure 7:
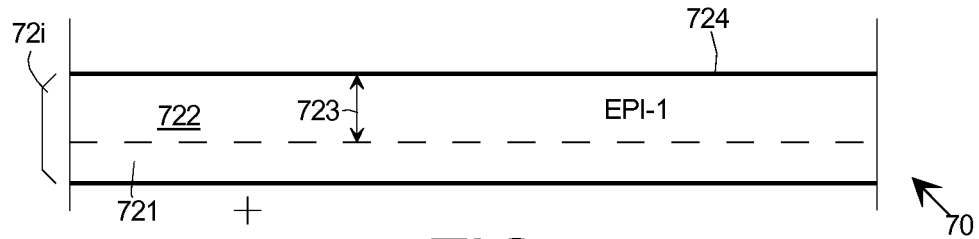
FIGS. 7-17 are simplified cross-sectional views of an ESD clamp transistor of the type illustrated in FIG. 4 during various stages of manufacture according to yet further embodiments of the present invention and showing additional detail.

Referring now to manufacturing stage 108 of FIG. 7, initial semiconductor substrate 72i (e.g., P) is provided wherein lower portion 721 is preferably boron doped at about 5E18 $cm^{-3}$ and upper portion (e.g., EPI-1) 722 with upper surface 724 is preferably boron doped at about 2E15 $cm^{-3}$. Upper portion 722 is preferably formed by epitaxial deposition and is referred to as EPI-1. Thickness 723 of EPI-1 layer 722 is conveniently in the range of about 7 to 8 micrometers, but larger or smaller thicknesses may also be used. In other embodiments, initial SC substrate 72i may be formed in other ways. Either arrangement is useful. Structure 208 results.

Figure 8:
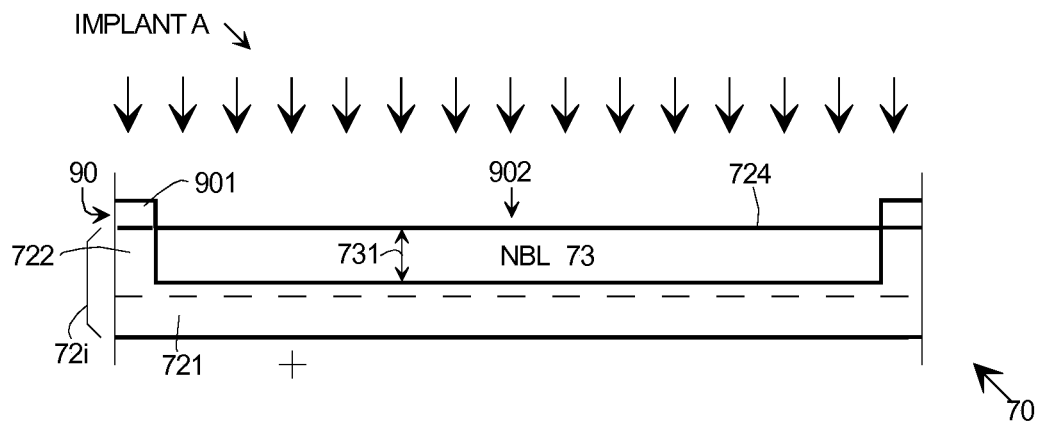
Figure 9:
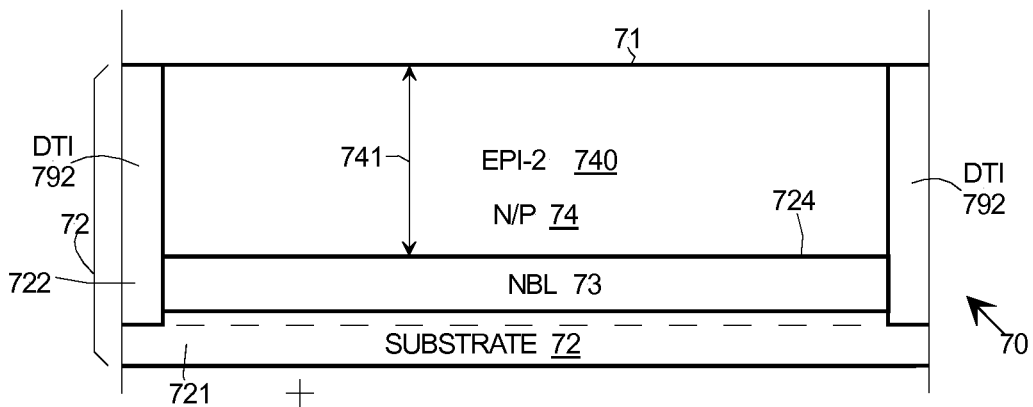

Referring now to manufacturing stage 109 of FIG. 8, mask 90 having closed portions 901 and open portion 902 is applied over surface 724 of structure 208. Implant A is provided through open portion 902 to form NBL region 73 in substrate 72i. For silicon SC, antimony is a suitable dopant for NBL layer 73. A peak doping density of about 1E19 $cm^{-3}$ and thickness 731 in the range of about 1 to 2 micrometers below surface 724 is preferred but other dopants, concentrations and depths may also be used. Structure 209 results. Referring now to manufacturing stage 110 of FIG. 9, mask 90 is removed and second epitaxial layer 740 ("EPI-2") of thickness 741 of about 3 to 4 micrometers is preferably formed on surface 724 over substrate 72i with NBL 73. EPI-2 layer 740 may be either N or P doped, as has been previously noted, and is conveniently grown with a doping density of about 2E15 $cm^{-3}$, but larger or smaller doping levels and thicknesses may also be used. In a preferred embodiment, boron is used to provide P type doping, but other dopants may also be used. EPI-2 layer 740 has upper surface 71 and provides N/P region 74 of device 70. Substantially dielectric filled deep trench isolation (DTI) regions 792 are conveniently provided extending substantially from surface 71 to P type lower portion 721 in the locations indicated using means well known in the art. DTI regions 792 provide lateral electrical isolation between ESD transistor 70 subsequently formed in EPI-2 region 740 between DTI regions 792 and other devices or elements located laterally outside DTI regions 792 on the same substrate. Structure 210 results, hereafter referred to as substrate 72. Person of skill in the art will understand that substrate 72 illustrated in structure 210 may also be formed in other ways and in other sequences. For example and not intended to be limiting, DTI regions 792 may be formed at other stages of the manufacturing process before or after any of the stages illustrated here.

Figure 10:
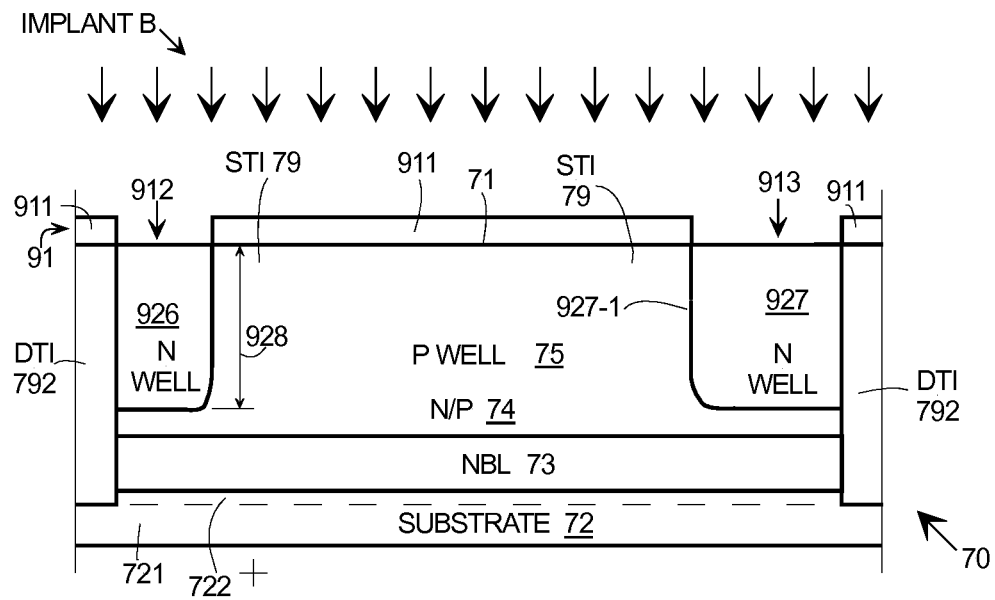
Figure 11:
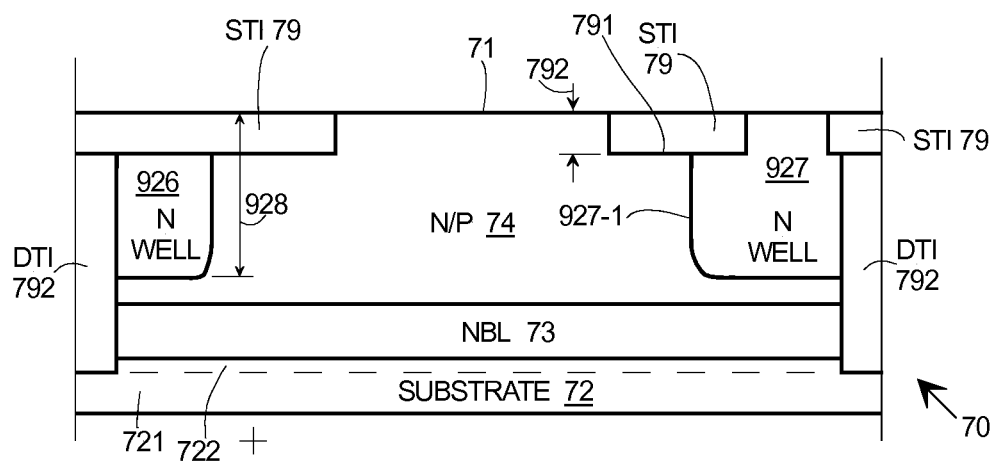

Referring now to manufacturing stage 111 of FIG. 10, mask 91 having closed portions 911 and openings 912, 913 is applied over surface 71 of EPI-2 layer 740 of substrate 72. N-type Implant B is provided through openings 912, 913 to form N WELL regions 926, 927 with boundary 927-1 Phosphorous and arsenic are suitable dopants for such N WELL regions. A peak arsenic concentration in the range of about 1E18 $cm^{-3}$ is preferred at or near surface 71. A peak phosphorous concentration of about 1-2E17 $cm^{-3}$ located about 0.5 micrometers beneath surface 71 and having a total depth 928 about 25% to 75% of thickness 741 of EPI-2 layer 740 is preferred, but other dopants and doping densities and depths may also be used. Structure 211 results. Referring now to manufacturing stage 112 of FIG. 11, conventional shallow trench dielectric isolation (STI) regions 79 of depth 792 and having lower dielectric-semiconductor interface 791 are desirably formed at the indicated locations in surface 71 of structure 211, using means well known in the art. Depth 792 is usefully in the range of about 0.05 to 2 micrometers, more conveniently about 0.2 to 0.5 micrometers and preferably about 0.36 micrometers, although thicker and thinner STI regions may also be used. The surface is conveniently planarized after STI formation to re-expose surface 71 of SC substrate 72. Structure 212 results. While STI regions 79 are desirable, in other embodiments, they may be omitted and interface 791 may be considered as the interface with any overlying surface dielectric.

Figure 12:
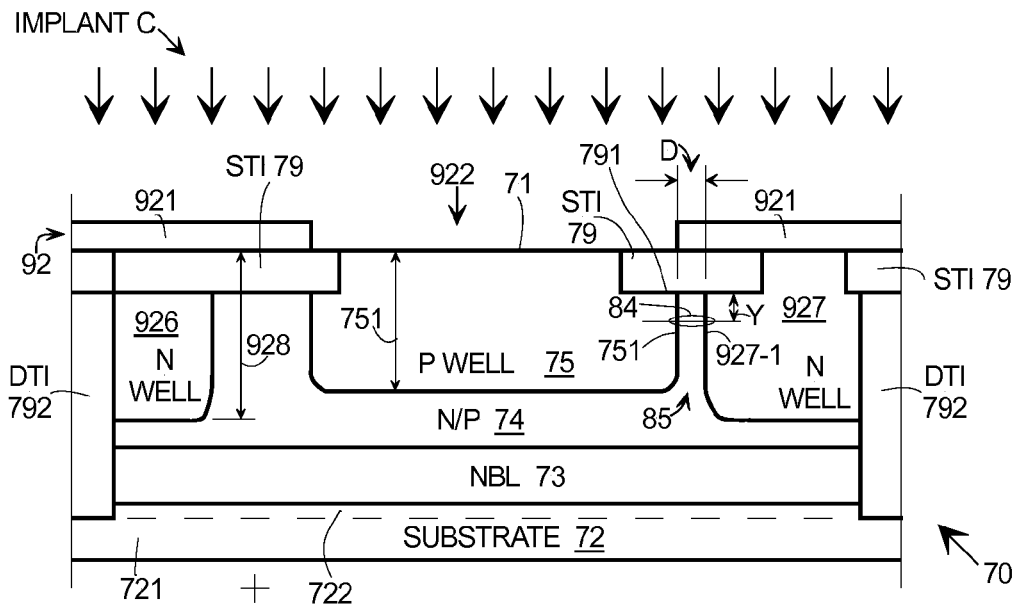

Referring now to manufacturing stage 113 of FIG. 12, mask 92 is applied over surface 71 having closed portions 921 and openings 922. P-type chain Implant C of, for example boron, is provided through openings 922 of mask 92 to form P WELL 75 at the indicated location with lateral boundary or interface 751 facing toward boundary 927-1 of N WELL region 927. As will be subsequently explained, interface or boundary 927-1 of FIGS. 10-13 corresponds to interface or boundary 861 of FIGS. 4 and 14-18. P WELL 75 preferably has depth 752 from surface 71 of about 30 to 70 percent of EPI-2 thickness 741. A peak dopant concentration us usefully in the range of about 1E17 $cm^{-3}$ to 1E18 $cm^{-3}$ with about 4E17 $cm^{-3}$ to 8E17 $cm^{-3}$ being preferred, usefully at a depth of about 0.5 to 0.9 micrometers below surface 71, but larger and smaller depths and dopant densities and other dopants may also be used. Stated another way, the peak doping concentration at interface or boundary 751 of P WELL 75 is usefully located at depth Y>0 micrometers, conveniently at about depth Y≥0.1 micrometers, more desirably at about depth Y≥0.2 micrometers and preferably at about depth Y≥0.3 micrometers below interface 791 of interface 791 (e.g., of STI region 79). In embodiments in which STI regions 79 are omitted and/or replaced by a surface dielectric (e.g., dielectric 81 of FIG. 4 or 18), then interface 791 should be interpreted to refer to the interface between such surface dielectric or passivation layer and the underlying semiconductor encompassing intermediate portion 85 of width D.

The details of preferred chain implants for Implants B and C are illustrated in Tables I and II hereafter. As is explained above and in connection with the discussion of Tables I and II and FIG. 18, the combination of Implants B and C result in doping profiles or boundaries 751, 861 that cause avalanche region 84 to be located within the bulk of intermediate portion 85 of region 74 (see FIG. 4), at distance Y beneath interface 791. While the chain implants identified in Tables I and II are preferred, other dopants, concentrations and depths may also be used, provided that the resulting doping profiles locate avalanche region 84 usefully at depth Y as described above. It has been found that such arrangement markedly decreases the azimuthal orientation sensitivity of base-collector spacing dimension D and therefore substantially reduces the azimuthal variation of trigger voltage Vt1. Structure 213 results.

Figure 13:
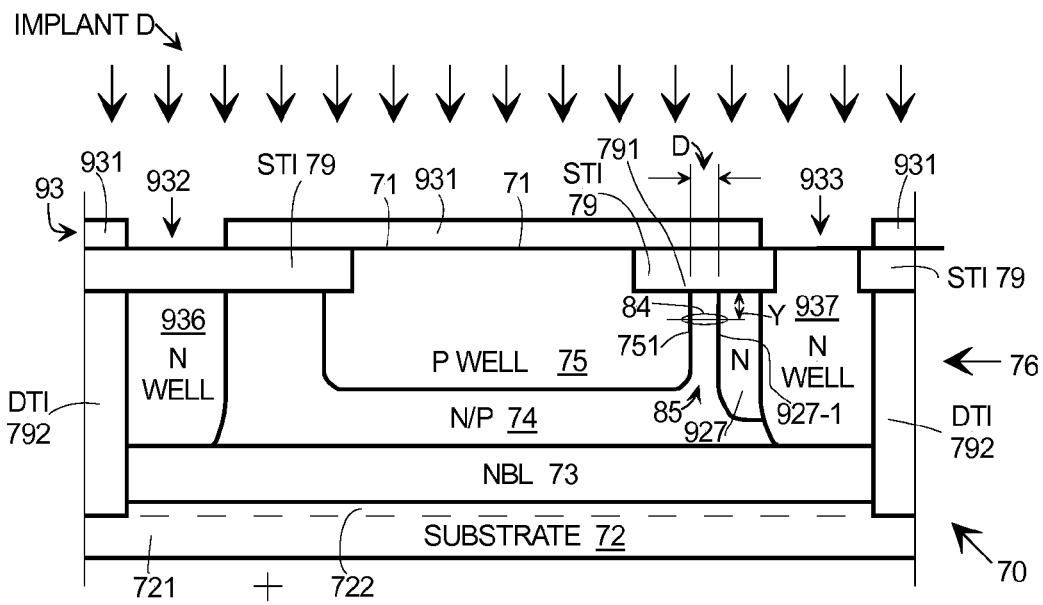

Referring now to manufacturing stage 114 of FIG. 13, mask 92 is removed and replaced with mask 93 having closed portions 931 and openings 932, 933. N-type Implant D is provided through openings 932, 933 to form N WELL regions 936, 937 associated with transistor 70. In a preferred embodiment, opening 932 of mask 93 is substantially coincident with openings 912 of mask 91, but in other embodiments may differ. Again, in a preferred embodiment, openings 933 of mask 93 is narrower and lies within opening 913 of mask 91, but may have other extents in further embodiments. The purpose of mask 93 with openings 932, 933 and Implant D is to extend N WELL regions 926, 927 of manufacturing stage 111 to form N WELL regions 936, 937 making Ohmic electrical contact with NBL 73. Phosphorous is a suitable dopant for Implant D to form N WELL regions 936, 937. A first peak concentration in the range of about $5E17$ cm$^{-3}$ to $2E18$ cm$^{-3}$ at a first depth below surface 71 is usefully in the range of about 0.3 to 1 micrometers and preferably about 0.75 micrometers, and a second peak concentration usefully in the range of about $4E17$ cm$^{-3}$ to about $1E18$ cm$^{-3}$ at a second depth below surface 71 in the range of about 1.5 to 2 micrometers and preferably about 1.8 micrometers, and a total depth as noted above sufficient to electrically couple N WELL regions 936, 937 to NBL 73. However, in other embodiments, other dopants and doping densities and depths may also be used. Structure 214 results. N WELLS 936, 937 correspond to N WELLS 761, 762 (collectively 76) of device 70 of FIG. 4 and are identified as such hereafter. The portion of N WELL 927 with lateral boundary or interface 927-1 formed in FIG. 12 that extends laterally beyond N WELL 937 formed in FIG. 13 corresponds to further N region 86 of FIG. 4 with lateral boundary 861, and is identified as such hereafter. Manufacturing stages 113, 114 may be performed in either order and may be performed before or after manufacturing stages 111, 112.

Figure 14:
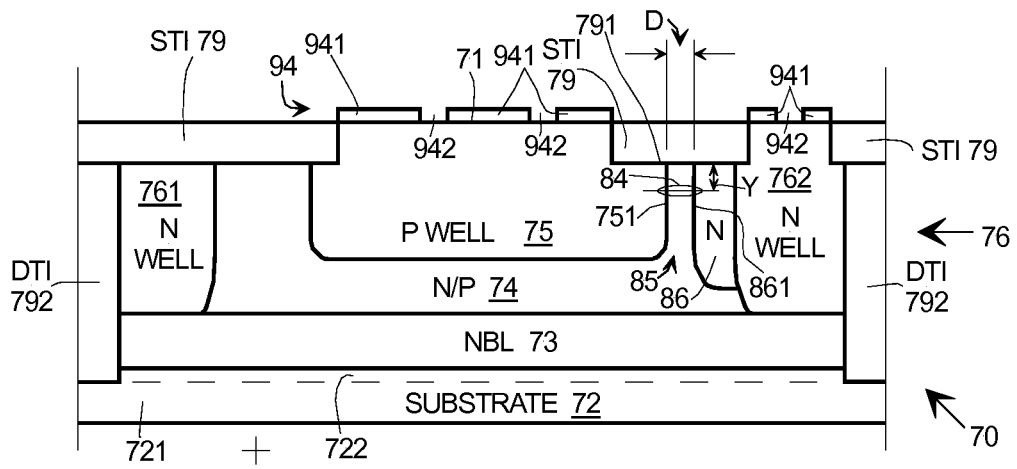

Referring now to manufacturing stage 115 of FIG. 14, mask layer 93 is removed and "silicide block" layer 94 applied over surface 71 and patterned to provide silicide block regions 941 wherever it is desired to prevent reaction between a silicide forming conductor (to be deposited later) and exposed portions of semiconductor surface 71, and with openings 942 between silicide block regions 941 where it is desired for the subsequently deposited conductor to form silicides ensuring good Ohmic contact to the underlying portions of SC surfaced 71. In a preferred embodiment, silicide block layer 94 preferably comprises a first layer of silicon oxide of about 10-20 nanometers thickness overlying surface 71 followed by a second layer of silicon nitride of about 40-80 nanometers thickness overlying the first layer, but other materials and thicknesses may also be used in other embodiments. Structure 215 results. While provision of silicide block regions 941 is desirable, they may be omitted in yet further embodiments. Accordingly, in subsequent FIGS. 15-17, silicide block regions 941 are indicated by dashed lines and ignored in FIG. 4 since they become incorporated in surface dielectric layer 81 applied in manufacturing stage 118.

Figure 15:
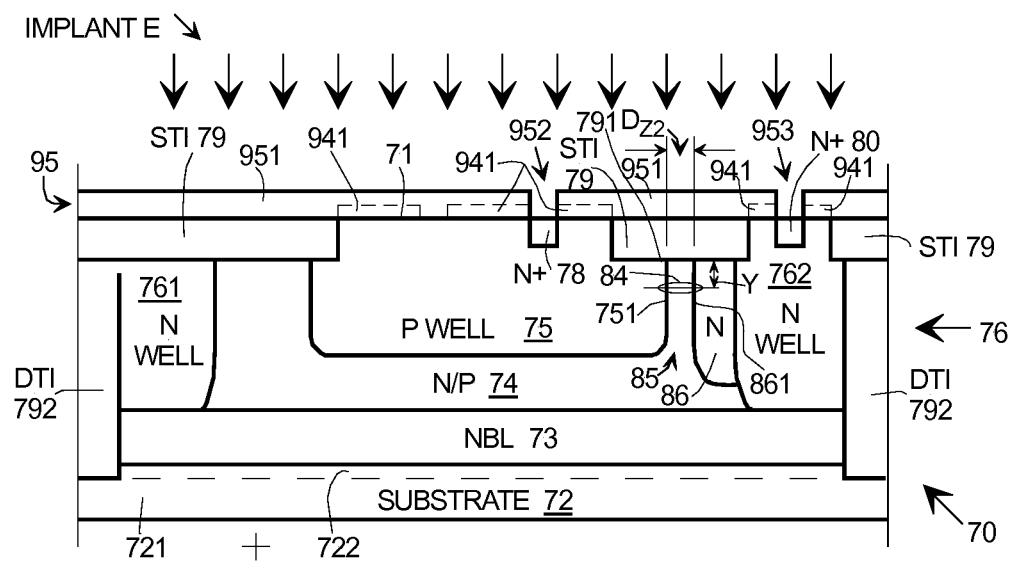

Referring now to manufacturing stage 116 of FIG. 15, mask 95 is applied over surface 71 and silicide block regions 941. Mask 95 has closed portions 951 and openings 952, 953 corresponding to the desired locations of (e.g., N+) doped Ohmic contact regions to be formed using Implant E. N-type Implant E is provided through openings 952, 953, wherein N+ doped Ohmic emitter region 78 is formed through opening 952 and N+ doped Ohmic collector contact region 80 is formed through opening 953. The dopant, energy and dose of Implant E are selected so as to provide relatively shallow highly doped N+ regions, as for example, employing arsenic dopant, with a peak concentration of about $1E20$ cm$^{-3}$ or greater and depth of about 0.3 micrometers, but other dopants, concentrations and depths may also be used. Structure 216 results.

Figure 16:
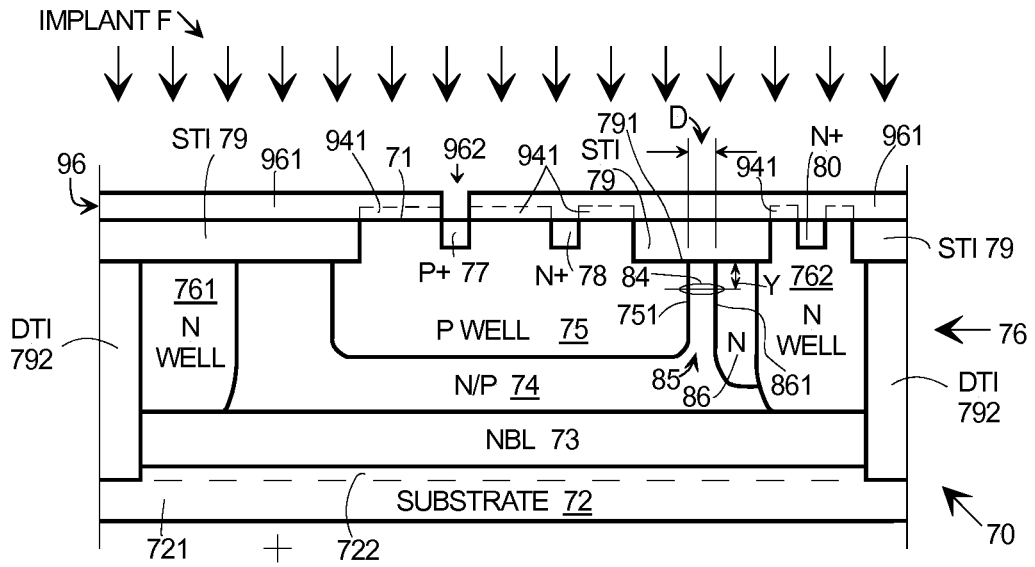

Referring now to manufacturing stage 117 of FIG. 16, mask 95 is removed and mask 96 applied with closed portions 961 and opening 962 corresponding to the desired locations of (e.g., P+) doped Ohmic contact region 77 to be formed using Implant F. P-type Implant F is provided wherein P+ doped Ohmic contact region 77 is formed through opening 962. The dopant, energy and dose of Implant F are selected so as to provide relatively shallow highly doped P+ regions, as for example, employing boron dopant, with a peak concentration of about $1E20$ cm$^{-3}$ or greater and depth of about 0.2 micrometers, but other dopants, concentrations and depths may also be used. Structure 217 results.

Figure 17:
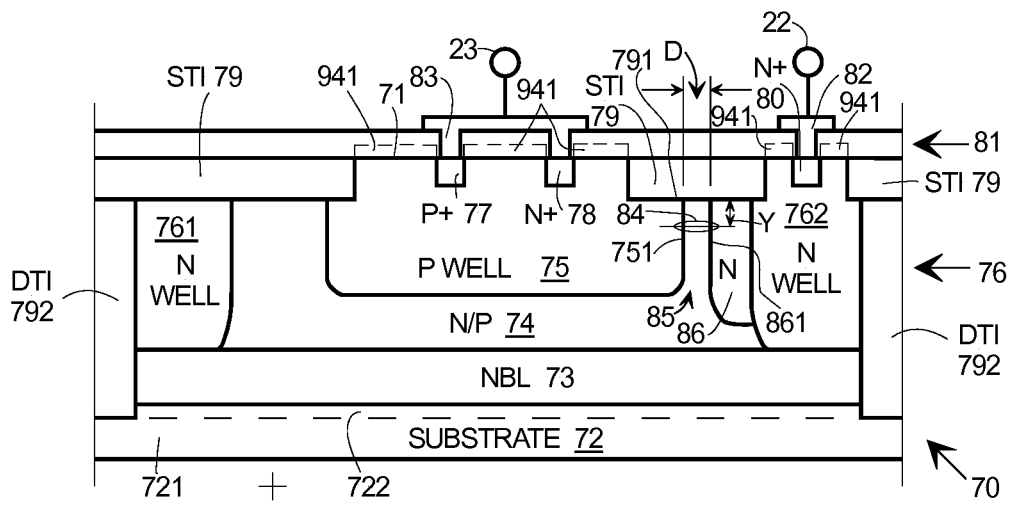
Figure 18:
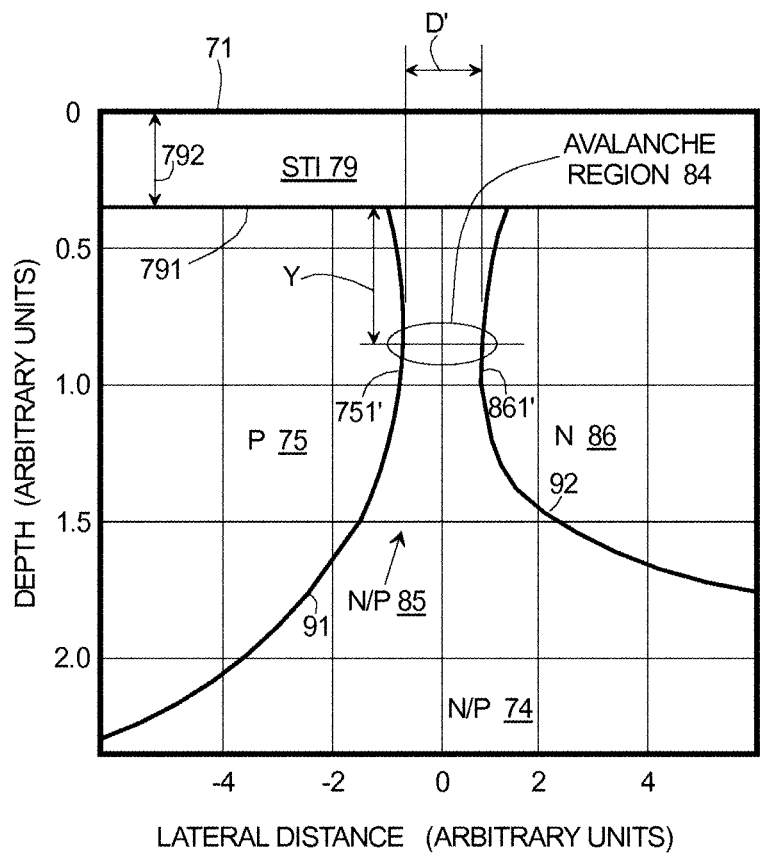
FIG. 18 is a simplified schematic cross-sectional representation of the region surrounding the avalanche break-down region within the ESD transistor of FIGS. 4 and 18, much enlarged and showing further detail.

Referring now to manufacturing stage 18 of FIG. 17, mask 96 is removed, dielectric layer 81 is applied and patterned to expose those portions of doped contact regions 77, 78, 80 where Ohmic electrical contact is desired to be made and conductors 82, 83 applied therein and coupled to terminals 23, 22, all using means and methods well known in the art. Structure 218 results. ESD clamp 70 is substantially complete. While manufacturing stages 108-118 have illustrated how single polarity (unidirectional) clamp transistor 70 of FIG. 4 is formed, persons of skill in the art will understand based on the description herein that dual polarity (bi-directional) clamp 700 of FIG. 5 may be fabricated in substantially the same manner using substantially the same manufacturing stages as those described in connection with FIGS. 8-18 with appropriately modified mask openings so as to form clamp transistor 70R at the same time as clamp transistor 70 in relative proximity and interconnected as indicated in FIG. 5.

FIG. 18 is a simplified schematic cross-sectional representation of region 90 surrounding avalanche break-down region 84 within ESD transistor 70 of FIG. 4, enlarged and showing further detail. The ordinate (depth) and abscissa (lateral distance) are presented in arbitrary units since the purpose of FIG. 18 is not intended to make a cross-sectional map of a particular device but to illustrate conceptually how the structure and method described herein provide doped regions 75, 85 and 86 having effective boundaries 751', 861' (analogous to boundaries 751, 861) spaced apart by minimum effective distance D' (analogous to distance D) that result in avalanche region 84 being located at distance Y beneath dielectric-semiconductor interface 791. Effective boundaries 751', 861' and effective distance D' of FIG. 18 differ from geometric boundaries 751, 861 and distance D of FIGS. 4-5 and 14-17 in that effective boundaries 751', 861' and effective distance D' take into account the impact of the relative doping levels of regions 75, 85 and 86, as explained below. Trace 91 illustrates an approximate outline of effective boundary or interface 751' of P WELL 75 in the vicinity of avalanche region 84 and trace 92 illustrates an approximate outline of effective boundary or interface 861' of further N region 86 in the vicinity of avalanche region 84, separated by minimum effective distance D'. Avalanche region 84 occurs in more lightly doped region 85 that lies substantially between effective boundaries 751', 861', generally where effective boundaries 751', 861' have minimum effective separation distance D'. For a given applied voltage, the electric field leading to avalanche conditions is larger when D' is smaller. D' is smaller when the relative doping of one or both of adjacent regions 75, 86 is substantially greater than the doping of base-collector spacing region 85 or both. Other things being equal, if the relative doping of regions 75 and 86 is closer to that of region 85, then the depletion region expands into adjacent regions 75 and 86 and effective distance D' (and Vt1) increase and, conversely, effective distance D' (and Vt1) decreases as the ratio of the doping of adjacent regions 75, 86 to base-collector spacing region 85 increases. Simulation indicates that avalanche region 84 in the described embodiments occurs below interface 791 by distance Y when the effective doping profiles or boundaries 751', 861' of regions 75 and 86 provide approximately facing peaks dopants concentrations at such depth, or where at least one peak dopant concentration is facing a more uniform or other doping concentration, separated by minimum effective distance D'.

Tables I and II below indicates implant doping conditions that result in the favorable structure illustrated in FIG. 18 and provide traces 67, 68 of FIG. 6. Less favorable doping conditions also shown in Table I provide less optimum structures, resulting in traces 65, 66 of FIG. 6. Referring to FIG. 6 and Table I together, it will be noted that implant conditions with high implant energies (and thus deeper peak dopant concentrations) provide favorable effective boundary or interface contours 751', 861' illustrated in FIG. 18 and result in traces 67 and 68 of FIG. 6 that exhibit substantially lower values of $(\Delta Vt1)_{MAX}$. Conversely, other structures and fabrication methods using lower implant energies and shallower doped regions result in traces 65, 66 of FIG. 6 with substantially larger values of $(\Delta Vt1)_{MAX}$.

TABLE I

Implant B Conditions Leading to Traces 65-68 of FIG. 6

| 1<br>Trace in<br>FIG. 7 | 2<br>As cm$^{-2}$<br>@100 keV | 3<br>P31 cm$^{-2}$<br>@100 keV | 4<br>P31 cm$^{-2}$<br>@300 keV | 5<br>P31 cm$^{-2}$<br>@400 keV | 6<br>P31 cm$^{-2}$<br>@720 keV |
|---|---|---|---|---|---|
| 65 |  | 3.8E14@ 7° | 3.8E14@ 7° |  |  |
| 66 |  | 3.8E14@ 0° | 3.8E14@ 0° |  |  |
| 67 | 3E13@ 0° | 4E12@ 7° |  | 3E12@ 0° | 3E13@ 0° |
| 68 | 8E13@ 0° | 4E12@ 7° |  | 3E12@ 0° | 3E13@ 0° |

Table I has 6 columns and 6 rows. Row 1 identifies columns 1-6. Column 1 identifies the traces in FIG. 6 to which the data presented in Columns 2-6 correspond. Row 2 identifies for each of columns 2-6, the implant dopant (either arsenic or phosphorous 31) and the energy at which such dopant was implanted. Rows 3-6 in columns 2-6 identify the dose in ions per square centimeter and the angle of the ion beam with respect to the surface normal. For example, in column 3 of row 3, the entry 3.8E14@ 7° indicates that a dose of 3.8E14 cm$^{-2}$ of the dopant ions named in row 2 of column 3 was applied at 7 degrees with respect to the surface normal at the energy named in row 2 of column 3.

The implant conditions for forming P WELL 75 were the same for all of the tests of Table I. A chain implant was used for Implant C as identified in Table II. Only Implants 1 and 2 of Table II are relevant to the discussion of achieving the desired depth Y>0 for avalanche region 84, since the others used low energies and the dopants provided thereby remain substantially in STI region 79 above dielectric-semiconductor interface 791. In other embodiments, such low energy implants may be omitted.

TABLE II

Implant C Conditions Leading to Traces 65-68 of FIG. 6

| 1 | 2<br>Species | 3<br>Dose (cm$^{-2}$) | 4<br>Energy (keV) | 5<br>Tilt (°) |
|---|---|---|---|---|
| Implant 1 | Boron | 2.0E13 | 300 | 0 |
| Implant 2 | Boron | 8.0E12 | 200 | 0 |
| Implant 3 | Boron | 2.6E12 | 80 | 0 |

TABLE II-continued

Implant C Conditions Leading to Traces 65-68 of FIG. 6

| 1 | 2<br>Species | 3<br>Dose (cm$^{-2}$) | 4<br>Energy (keV) | 5<br>Tilt (°) |
|---|---|---|---|---|
| Implant 4 | Boron | 2.0E12 | 40 | 0 |
| Implant 5 | BF$_2$ | 6.8E12 | 35 | 0 |

Much can be learned from the data of Tables I and II in conjunction with FIG. 6. For example, it is apparent that using lower implant energies and therefore obtaining shallower implants yields traces 65, 66 of FIG. 6 having larger $(\Delta Vt1)_{MAX}$ values over a significant range of spacing dimension D. Decreasing the implant angle to zero (e.g., row 3 of Table I) at the same relatively low energies, makes things worse, as shown by trace 66 of FIG. 6 wherein, $(\Delta Vt1)_{MAX}$ is larger. Also, increasing the low energy dose (row 6, column 2 of Table I), does not give as good a result as was obtained with otherwise similar implant conditions but a smaller low energy dose, as for example with the most favorable results obtained for the conditions of trace 67 of FIG. 6 corresponding to row 5. It will be appreciated that by combining the structure of FIGS. 4-5 with doping conditions that provide minimum effective separation distance D' (and therefore avalanche region 84) located usefully at depth Y>0, conveniently at about depth Y≥0.1 micrometers, more desirably at about Y≥0.2 micrometers and preferably at about Y≥0.3 micrometers beneath dielectric-semiconductor interface 791, that reduced values of $(\Delta Vt1)_{MAX}$ can be obtained. This is a significant advance in the art.

According to a first embodiment, there is provided, electronic assembly (20), comprising, first (23) and second (22) external terminals, a core circuit (24) coupled between the first (23) and second (22) external terminals, a bipolar transistor electrostatic discharge (ESD) clamp (21, 21', 70, 700) coupled between the first (23) and second (22) external terminals, wherein the bipolar transistor electrostatic discharge (ESD) clam (21, 21' 70, 700) comprises, an emitter region (78) of a first doping density electrically coupled to the first terminal (23), a collector region (86) of a second doping density electrically coupled to the second terminal (22), a base region (75) of a third doping density located between the emitter region and the collector region, and a further region (85) of a fourth doping density located between the base region (75) and the collector region (86), wherein at least the further region (85) extends to an overlying dielectric-semiconductor interface (791), and wherein the base region (75) has a first dopant boundary (751) with the further region (85) and the collector region (86,) has a second dopant boundary (861) with the further region (85) and wherein at least one (751 or 861) of the first (751) and second (861) dopant boundaries has a maximum dopant density at a distance Y>0 beneath the dielectric-semiconductor interface (791). According to a further embodiment, Y≥0.1 micrometers. According to a still further embodiment, the first (751) and second (861) dopant boundaries have maximum dopant concentrations at distances Y1 and Y2, respectively, beneath the dielectric-semiconductor interface (791), and wherein Y1>0 and Y2>0. According to a still further embodiment, the base region (75) and the collector region (86) are more heavily doped than the further region (85). According to a yet further embodiment, a peak dopant concentration of the base region (75) and a peak dopant concentration of the collector region (86) exceed an average dopant concentration of the further region (85) by at least a factor of 5. According to a still yet further embodiment, the peak dopant concentration of the base region (75) and the peak dopant concentration of the collector region (86) exceed the average dopant concentration of the further region (85) by at least a factor of 10. According to a yet still further embodiment, the emitter region (78) and a base contact region (77) are substantially shorted together. According to another embodiment, the first (751) and second (861) dopant boundaries are separated by a minimum distance D through the further region (85), and wherein the minimum distance D occurs at a depth Y>0 beneath the dielectric-semiconductor interface (791). According to a still another embodiment, the bipolar transistor electrostatic discharge (ESD) clamp (21, 21', 70, 700) is adapted to have an avalanche trigger voltage Vt1 substantially determined by D.

According to a second embodiment, there is provided a method for forming a bipolar transistor electrostatic discharge (ESD) clamp (21, 21', 70, 700), comprising, providing a semiconductor substrate (72) having a first region (74) of a first conductivity type or a second conductivity type and first and second dopant density, respectively, extending to a first surface (71), forming a first WELL region (762, 86) of a third conductivity type and third doping density extending from the first surface (71) into the first region (74) and having a first lateral boundary (927-1, 861), forming a second WELL region (75) of a fourth conductivity type opposite the third conductivity type and having a fourth doping density extending into the first WELL region and having a second lateral boundary (751) separated from the first lateral boundary (927-1, 861) by a minimum distance D across an intermediate portion (85) of the first region (74) having a fifth dopant density; forming a dielectric-semiconductor interface (791) overlying at least the intermediate portion (85), and wherein either: (i) the minimum distance D is located beneath the dielectric-semiconductor interface (791) by a distance Y>0, or (ii) the third and fourth doping densities exceed the fifth doping density at a distance Y>0 below the dielectric-semiconductor interface (791) by at least a factor of 5, or (iii) both (i) and (ii). According to a still further embodiment, Y≥0.1 micrometers. According to a yet further embodiment, Y≥0.2 micrometers. According to a still yet further embodiment, the third and fourth doping densities exceed the fifth doping density at a distance Y below the dielectric-semiconductor interface (791) by at least a factor of 10. According to a yet still further embodiment, the step of providing a semiconductor substrate (72) comprises providing a semiconductor substrate that has first (74) and second (74R) laterally arranged regions of a first or second conductivity type extending to a first surface (71), and wherein the step of forming a first WELL region (762, 86) comprises forming a first WELL region (762, 86; 762R, 86R) of a third conductivity type and third doping density extending from the first surface (71) between the first (74) and second (74R) laterally arranged regions, so that the first WELL region (762, 86, 762R, 86R) and has a first lateral boundary (861) in the first (74) region and a second lateral boundary (861R) in the second region (74R), and wherein the step of forming a second WELL region comprises forming first and second spaced-apart second WELL regions (75, 75R) of a fourth conductivity type opposite the third conductivity type and having a fourth doping density and extending, respectively, into the first (74) and second (74R) regions, wherein the first (75) of the second WELL regions has a third lateral boundary (751) spaced apart from the first lateral boundary (861) by a distance D across a first intermediate portion (85) of the first region (74) having the fifth dopant density, and the second (75R) of the second WELL regions has a fourth lateral boundary (751R) spaced apart from the second lateral boundary (861R} by a distance DR across a second intermediate portion (85R) of the first region (74R) having the fifth doping density, and wherein the step of forming a dielectric-semiconductor interface (791), comprises forming a dielectric-semiconductor interface (791) overlying the first intermediate portion (85) and forming a dielectric-semiconductor interface (791R) overlying the second intermediate portion (85R); and wherein the distances D and DR are located beneath the dielectric-semiconductor interfaces (791, 791R), respectively, by depths $Y_D$>0 and $Y_{DR}$>0, respectively. According to another embodiment, D and DR are substantially equal. According to a still another embodiment, the method further comprises providing first (78) and second (78R) contact regions of the third conductivity type and third (77) and fourth (77R) contact regions of the fourth conductivity type in the first (75) and second (75R) spaced apart second WELL regions, wherein the first (78) and third (77) contact regions are coupled together and to a first terminal (23) of the bipolar transistor electrostatic discharge (ESD) clamp (21, 21', 70, 700) and the second (78R) and fourth (77R) contact regions are coupled together and to a second terminal (22) of the bipolar transistor electrostatic discharge (ESD) clamp (21', 700).

According to a third embodiment, there is provided a bipolar transistor electrostatic discharge (ESD) clamp (21, 21', 70, 700) formed in a substrate (72) having a first surface (71), and coupled to first (23) and second (22) terminals, and comprising, an emitter (78) coupled to the first terminal (23), a collector (86, 762) coupled to the second terminal (22), a base (75) located between the emitter (78) and the collector (86, 762) and an intermediate semiconductor portion (85) coupled between the base (75) and the collector (86, 762) and more lightly doped than the base (75) and the collector (86, 762), wherein at least the intermediate semiconductor portion (85) extends to a dielectric-semiconductor interface (791) at or near the first surface (71), and wherein the intermediate semiconductor portion (85) has a first interface (751) with the base (75) and second interface (861) with the collector (86, 762) extending away from the dielectric-semiconductor interface (791) and wherein the first and second interfaces (751, 861) have a minimum separation D located a distance Y>0 below the dielectric-semiconductor interface (791). According to a further embodiment, Y≥0.1 micrometers. According to a still further embodiment, the clamp further comprises a buried layer region underlying the base (75) and Ohmically coupled to the collector (86, 762). According to a yet further embodiment, the intermediate semiconductor portion (85) is more lightly doped than the base (75) and the collector (86, 762) by at least a factor of 5.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a bipolar transistor electrostatic discharge (ESD) clamp, comprising:
providing a semiconductor substrate having a first region of a first conductivity type or a second conductivity type and first and second dopant density, respectively, extending to a first surface;
forming a first WELL region of a third conductivity type and third doping density extending from the first surface into the first region and having a first lateral boundary;
forming a second WELL region of a fourth conductivity type opposite the third conductivity type and having a fourth doping density extending into the first WELL region and having a second lateral boundary separated from the first lateral boundary by a minimum distance D across an intermediate portion of the first region having a fifth dopant density; and
forming a dielectric-semiconductor interface overlying at least the intermediate portion;
wherein either: (i) the minimum distance D is located beneath the dielectric-semiconductor interface by a distance Y>0, or (ii) the third and fourth doping densities exceed the fifth doping density at a distance Y>0 below the dielectric-semiconductor interface by at least a factor of 5, or (iii) both (i) and (ii).

2. The method of claim 1, wherein Y≥0.1 micrometers.

3. The method of claim 2, wherein Y≥0.2 micrometers.

4. The method of claim 1, wherein the third and fourth doping densities exceed the fifth doping density at a distance Y below the dielectric-semiconductor interface by at least a factor of 10.

5. The method of claim 1, wherein:
the step of providing a semiconductor substrate comprises providing a semiconductor substrate that has first and second laterally arranged regions of a first or second conductivity type extending to a first surface, and wherein;
the step of forming a first WELL region comprises forming a first WELL region of a third conductivity type and third doping density extending from the first surface between the first and second laterally arranged regions, so that the first WELL region and has a first lateral boundary in the first region and a second lateral boundary in the second region; and wherein
the step of forming a second WELL region comprises forming first and second spaced-apart second WELL regions of a fourth conductivity type opposite the third conductivity type and having a fourth doping density and extending, respectively, into the first and second regions, wherein the first of the second WELL regions has a third lateral boundary spaced apart from the first lateral boundary by a distance D across a first intermediate portion of the first region having the fifth dopant density, and the second of the second WELL regions has a fourth lateral boundary spaced apart from the second lateral boundary by a distance DR across a second intermediate portion of the first region having the fifth doping density, and wherein;
the step of forming a dielectric-semiconductor interface, comprises forming a dielectric-semiconductor interface overlying the first intermediate portion and forming a dielectric-semiconductor interface overlying the second intermediate portion, and wherein;
the distances D and DR are located beneath the dielectric-semiconductor interfaces, respectively, by depths $Y_D>0$ and $Y_{DR}>0$, respectively.

6. The method of claim 5, wherein D and DR are substantially equal.

7. The method of claim 5, further comprising providing first and second contact regions of the third conductivity type and third and fourth contact regions of the fourth conductivity type in the first and second spaced apart second WELL regions, wherein the first and third contact regions are coupled together and to a first terminal of the bipolar transistor electrostatic discharge (ESD) clamp and the second and fourth contact regions are coupled together and to a second terminal of the bipolar transistor electrostatic discharge (ESD) clamp.

8. A method for forming a bipolar transistor electrostatic discharge (ESD) clamp coupled to first and second external terminals between which a core circuit is coupled, the method comprising:
forming an emitter region of a first doping density electrically coupled to the first terminal;
forming a collector region of a second doping density electrically coupled to the second terminal;
forming a base region of a third doping density located between the emitter region and the collector region; and
forming a further region of a fourth doping density located between the base region and the collector region, at least the further region extending to an overlying dielectric-semiconductor interface;
wherein the base region has a first dopant boundary with the further region and the collector region has a second dopant boundary with the further region; and
wherein at least one of the first and second dopant boundaries has a maximum dopant density at a distance Y>0 beneath the dielectric-semiconductor interface.

9. The method of claim 8, wherein Y>0.1 micrometer.

10. The method of claim 8, further comprising forming the first and second dopant boundaries to have maximum dopant concentrations at distances Y1 and Y2, respectively, beneath the dielectric-semiconductor interface, wherein Y1>0 and Y2>0.

11. The method of claim 8, wherein the base region and the collector region are more doped more heavily than is the further region.

12. The method of claim 8, wherein the peak dopant concentration of the base region and the peak dopant concentration of the collector region exceed the average dopant concentration of the further region by a factor of at least 10.

13. The method of claim 8, wherein the emitter region and a base contact region are substantially shorted together.

14. The method of claim 8, wherein the first and second dopant boundaries are separated by a minimum distance D through the further region, and wherein the minimum distance D occurs at a depth Y>0 beneath the dielectric-semiconductor interface.

15. The method of claim 14, wherein the bipolar transistor ESD clamp is adapted to have an avalanche trigger voltage Vt1 substantially determined by D.

16. A method for producing a bipolar transistor electrostatic discharge (ESD) clamp coupled to first and second terminals, the method comprising:
forming in a substrate an emitter coupled to the first terminal;
forming in the substrate a collector coupled to the second terminal;
forming in the substrate a base between the emitter and the collector;
forming a dielectric-semiconductor interface at or near a first surface of the substrate; and producing the bipolar transistor ESD clamp to further include an intermediate semiconductor portion in the substrate, which is coupled between the base and the collector, which is more lightly doped than the base and the collector, and which extends to the dielectric-semiconductor interface;

wherein the intermediate semiconductor portion has a first interface with the base and second interface with the collector extending away from the dielectric-semiconductor interface; and wherein the first and second interfaces have a minimum separation D located a distance Y>0 below the dielectric-semiconductor interface.

17. The method of claim 16, wherein Y>0.1 micrometers.

18. The method of claim 16, further comprising forming a buried layer region underlying the base and Ohmically coupled to the collector.

* * * * *